US012677675B2

(12) United States Patent
Yim et al.

(10) Patent No.: US 12,677,675 B2
(45) Date of Patent: Jul. 7, 2026

(54) SEMICONDUCTOR PACKAGE HAVING A PACKAGE SUBSTRATE INCLUDING A FIRST AREA AND A SECOND AREA AND METHOD OF FABRICATING THE SAME

(71) Applicant: SAMSUNG ELECTRONICS CO., LTD., Suwon-si (KR)

(72) Inventors: Choong Bin Yim, Suwon-si (KR); Ji Yong Park, Suwon-si (KR); Jong Bo Shim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 321 days.

(21) Appl. No.: 18/454,464

(22) Filed: Aug. 23, 2023

(65) Prior Publication Data

US 2024/0105567 A1     Mar. 28, 2024

(30) Foreign Application Priority Data

Sep. 27, 2022     (KR) ........................ 10-2022-0122582

(51) Int. Cl.
H10W 70/05          (2026.01)
H10B 80/00          (2023.01)
                    (Continued)
(52) U.S. Cl.
CPC .......... H10W 70/093 (2026.01); H10B 80/00 (2023.02); H10W 70/60 (2026.01);
                    (Continued)
(58) Field of Classification Search
CPC ... H01L 21/4853; H01L 21/56; H01L 21/565; H01L 23/28; H01L 23/3107;
                    (Continued)

(56) References Cited

U.S. PATENT DOCUMENTS 8,018,034 B2     9/2011   Chi et al.
9,006,887 B2     4/2015   Swaminathan et al.
                    (Continued)

FOREIGN PATENT DOCUMENTS

KR     10-2012-0123928 A     11/2012
KR     10-2015-0090442 A      8/2015
KR     10-2017-0099515        9/2017

OTHER PUBLICATIONS

Office Action dated Feb. 2, 2026 issued in the corresponding Korean Patent Application No. 10-2022-0122582.

*Primary Examiner* — Cheung Lee

(74) *Attorney, Agent, or Firm* — MORGAN, LEWIS & BOCKIUS LLP

(57)          ABSTRACT

A semiconductor package includes a first package substrate having a first area and a second area that is distinct and separate from the first area, a first connection element disposed on the first area and having a first thickness, a first semiconductor chip connected to the first connection element, a second connection element disposed on the second area and having a second thickness that is greater than the first thickness, a third connection element disposed on the second connection element and electrically connected to the second connection element, a second package substrate disposed on the third connection element, and a second semiconductor chip disposed on the second package substrate.

19 Claims, 16 Drawing Sheets

(51) Int. Cl.

| | |
|---|---|
| *H10W 70/60* | (2026.01) |
| *H10W 70/65* | (2026.01) |
| *H10W 74/01* | (2026.01) |
| *H10W 74/10* | (2026.01) |
| *H10W 90/00* | (2026.01) |
| *H10W 72/00* | (2026.01) |
| *H10W 72/20* | (2026.01) |

(52) U.S. Cl.
CPC ........... *H10W 70/65* (2026.01); *H10W 74/01* (2026.01); *H10W 74/016* (2026.01); *H10W 74/111* (2026.01); *H10W 90/00* (2026.01); *H10W 90/701* (2026.01); *H10W 72/07252* (2026.01); *H10W 72/221* (2026.01); *H10W 90/722* (2026.01); *H10W 90/724* (2026.01)

(58) Field of Classification Search
CPC ............. H01L 23/3128; H01L 23/3185; H01L 23/49816; H01L 23/49838; H01L 23/538; H01L 23/5385; H01L 24/13; H01L 24/14; H01L 24/16; H01L 24/17; H01L 25/043; H01L 25/0657; H01L 25/105; H01L 25/50; H10B 80/00; H10W 70/093; H10W 70/611; H10W 70/65; H10W 72/20; H10W 74/01; H10W 90/00; H10W 90/701

See application file for complete search history.

(56) References Cited

U.S. PATENT DOCUMENTS

| | | | |
|---|---|---|---|
| 9,230,898 B2 | 1/2016 | Shin et al. | |
| 10,553,475 B2 | 2/2020 | Abdullah et al. | |
| 11,367,705 B2 | 6/2022 | Beyne | |
| 2010/0171207 A1 | 7/2010 | Shen et al. | |
| 2010/0276792 A1* | 11/2010 | Chi ..................... H01L 23/3128 | |
| | | | 257/E23.116 |
| 2010/0314736 A1 | 12/2010 | Ko et al. | |
| 2012/0280404 A1 | 11/2012 | Kwon et al. | |
| 2022/0181277 A1 | 6/2022 | Hsieh et al. | |

* cited by examiner

S4

DISPOSE SECOND SEMICONDUCTOR CHIP
ON SECOND PACKAGE SUBSTRATE — S5

FORM THIRD CONNECTION ELEMENT ON LOWER
SURFACE OF SECOND PACKAGE SUBSTRATE — S6

CONNECT SECOND CONNECTION ELEMENT TO THIRD
CONNECTION ELEMENT THROUGH REFLOW PROCESS — S7

END

1

SEMICONDUCTOR PACKAGE HAVING A PACKAGE SUBSTRATE INCLUDING A FIRST AREA AND A SECOND AREA AND METHOD OF FABRICATING THE SAME

CROSS-REFERENCE TO RELATED APPLICATION

This U.S. non-provisional patent application claims priority under 35 U.S.C. 119 to Korean Patent Application No. 10-2022-0122582 filed on Sep. 27, 2022 in the Korean Intellectual Property Office, the disclosure of is incorporated by reference in its entirety herein.

1. TECHNICAL FIELD

The present disclosure relates to a semiconductor package and a method of fabricating the same

2. DISCUSSION OF THE RELATED ART

A semiconductor device is an electronic component that relies on the electronic properties of a semiconductor material for its function. Semiconductor devices may be manufactured as single discrete devices and as integrated circuit (IC) chips that include several electric components.

High performance, high speed, and small sizes of the electric components have been increasingly demanded with continuing developments of the electronics industry. Responding to these trends, a package-on-package (POP)-type semiconductor package in which a package is stacked on a package is used. A thickness of a semiconductor chip mounted on the package may be increased to dissipate heat. However, in a structure of the POP-type semiconductor package, there is a limitation in increasing the thickness of the semiconductor chip. Further, increasing the thickness of the semiconductor chip may result in a non-wetting defect.

SUMMARY

Aspects of the present disclosure provide a semiconductor package with increased heat dissipation characteristics, and a method of fabricating the same. For example, the semiconductor package may be capable of dissipating heat while allowing for semiconductor chips to be thinner.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor package including a first package substrate having a first area and a second area that is distinct and separate from the first area, a first connection element disposed on the first area and having a first thickness, a first semiconductor chip connected to the first connection element, a second connection element disposed on the second area and having a second thickness that is greater than the first thickness, a third connection element disposed on the second connection element and electrically connected to the second connection element, a second package substrate disposed on the third connection element, and a second semiconductor chip disposed on the second package substrate.

According to an aspect of the present disclosure, there is provided a semiconductor package including a first package substrate having a first area and a second area that is distinct and separate from the first area, a first semiconductor chip disposed on the first area, a first connection element disposed on the second area, and a mold film configured to cover at least a part of the first semiconductor chip and the first connection element and expose an upper surface of the first connection element.

According to an aspect of the present disclosure, there is provided a method of fabricating a semiconductor package including forming a first semiconductor chip in a first area of a first package substrate, forming a first connection element in a second area of the first package substrate that is distinct and separate from the first area, forming a mold film to cover the first semiconductor chip and the first connection element, and grinding a part of the mold film that covers an upper surface of the first connection element to expose the upper surface of the first connection element.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, a semiconductor package and a method of fabricating the same according to an embodiment will be described with reference to the attached drawings.

Figure 1:
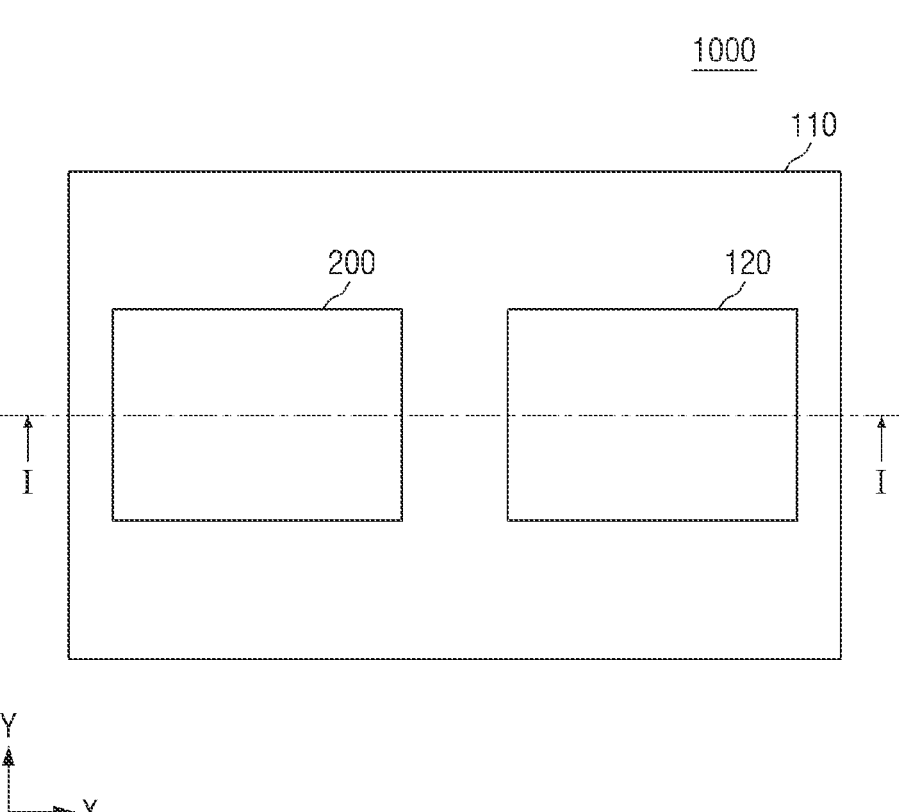
FIG. 1 is an example plan view of a semiconductor package according to an embodiment.
Figure 2:
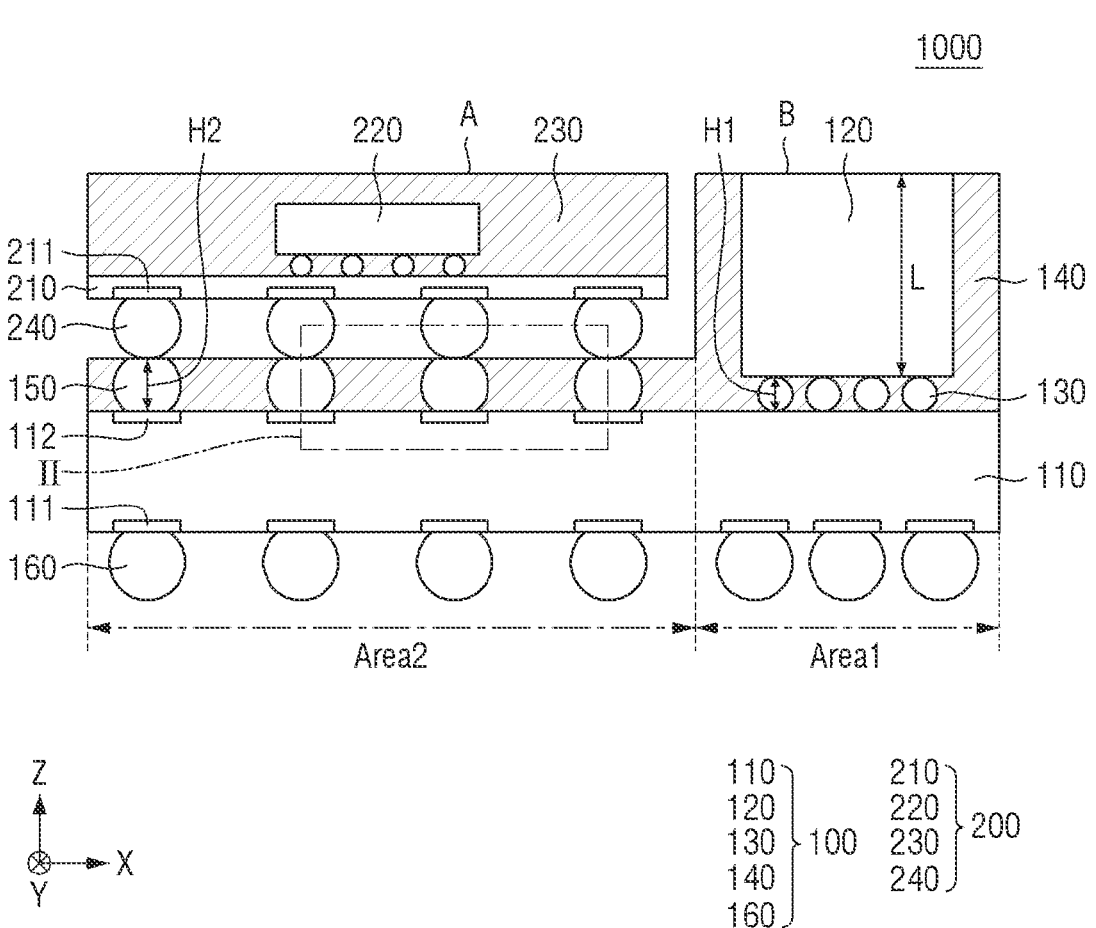
FIG. 2 is a cross-sectional view taken along line I-I of FIG. 1.

FIG. 1 is an example plan view of a semiconductor package according to an embodiment. FIG. 2 is a cross-sectional view taken along line I-I of FIG. 1.

Referring to FIGS. 1 and 2 together, a semiconductor package 1000 according to an embodiment may include a first semiconductor package 100, a second semiconductor package 200, and a second connection element 150. The first semiconductor package 100 may include a first package substrate 110, a first semiconductor chip 120, a first connection element 130, a first mold film 140, and a connection structure 160. The second semiconductor package 200 may include a second package substrate 210, a second semiconductor chip 220, a second mold film 230, and a third connection element 240. The surface of the first semiconductor package 100 and the surface second semiconductor package 200 may be visible in a plan view as shown in FIG. 1. A signal may be exchanged between the first semiconductor chip 120 and the second semiconductor chip 220 by passing through the first connection element 130 and the second connection element 150.

The semiconductor package 1000 according to some embodiments may be formed by stacking the first semiconductor package 100 and the second semiconductor package 200 in a side-by-side package structure. For example, the first semiconductor package 100 and the second semiconductor package 200 may be stacked side-by-side.

The package substrate 110 may be a printed circuit board (PCB) or a ceramic substrate (e.g., a ceramic layer). However, the present disclosure is not limited thereto. In a case where the first package substrate 110 is a PCB, the first package substrate 110 may be made of at least one material selected from among a phenolic resin, an epoxy resin, and polyimide. The first package substrate 110 may be made of at least one material selected from among tetrafunctional epoxy, polyphenylene ether, epoxy/polyphenylene oxide, bismaleimide triazine (BT), thermount, cyanate ester, and liquid crystal polymers.

The first package substrate 110 may include a resin impregnated with a core material such as glass fiber, glass cloth, glass fabric, or the like, together with an inorganic filler, for example, prepreg (PPG), Ajinomoto build-up film (ABF), FR-4, or bismaleimide triazine (BT).

A surface of the first package substrate 110 may be covered by a solder resist (e.g., a solder mask). The solder resist may be a thin lacquer-like layer of a polymer to protect against oxidation and to prevent solder bridges from forming between closely spaced solder pad. That is, a passivation film may be formed on the surface of the first package substrate 110 and the passivation film may include a photoimageable dielectric (PID). However, the present disclosure is not limited thereto.

A plurality of wiring patterns may be formed in the first package substrate 110. The wiring pattern may include a plurality of wiring vias electrically connecting the connection structure 160 to components disposed on the first package substrate 110. The wiring pattern may include, but is not limited to, at least one of copper (Cu), aluminum (Al), silver (Ag), tin (Sn), gold (Au), nickel (Ni), lead (Pb), titanium (Ti), or alloys thereof.

In an embodiment, at least one passive element (e.g., a resistor or a capacitor) may be installed inside or on the surface of the first package substrate 110. Also, the first package substrate 110 may include a first lower pad 111 and a first upper pad 112. The first lower pad 111 may be disposed on a lower surface of the first package substrate 110. The first upper pad 112 may be disposed on an upper surface of the first package substrate 110. The lower surface may oppose the upper surface.

The connection structure 160 may be formed on the lower surface of the first package substrate 110. The connection structure 160 may be disposed on the first lower pad 111. For example, the connection structure 160 may contact the first lower pad 111. The connection structure 160 may have, for example, a spherical or elliptical spherical solder ball or bump shape. The connection structure 160 may include a conductive material comprising at least one of, for example, tin (Sn), indium (In), lead (Pb), zinc (Zn), nickel (Ni), gold (Au), silver (Ag), copper (Cu), antimony (Sb), bismuth (Bi), or alloys thereof. However, the present disclosure is not limited to the above examples and the shape and material of the connection structure 160 may vary according to the embodiment.

The connection structure 160 (e.g., a connection terminal) may electrically connect the wiring patterns to an external device. For example, the external device may be located outside the semiconductor package 1000. Accordingly, the connection structure 160 may provide an electrical signal to the wiring patterns or an electrical signal provided from the wiring patterns to the external device.

The first semiconductor chip 120 may be disposed in a first area Area1 on the first package substrate 110. The first semiconductor chip 120 may include an integrated circuit (IC) in which hundreds to millions or more semiconductor elements are integrated inside a single chip. For example, the first semiconductor chip 120 may be, but is not limited to, an application processor (AP) such as a central processing unit (CPU), a graphic processing unit (GPU), a field-programmable gate array (FPGA), a digital signal processor, an encryption processor, a micro-processor, a micro-controller, or the like. For example, the first semiconductor chip 120 may be a logic chip such as an analog-digital converter (ADC) or an application-specific IC (ASIC), or may also be a memory chip such as a volatile memory (e.g., a dynamic random access memory (DRAM)), or a non-volatile memory (e.g., a random access memory (ROM) or a flash memory). Also, the first semiconductor chip 120 may be configured by a combination thereof.

In an embodiment, the first semiconductor chip 120 may be mounted on the first package substrate 110 by a flip chip bonding method. For example, the first connection element 130 may be formed between the upper surface of the first package substrate 110 and the lower surface of the first semiconductor chip 120. The first connection element 130 may electrically connect the first package substrate 110 to the first semiconductor chip 120. The first connection element 130 may include a conductive material, and may be in the shape of, for example, a solder, a bump, or a pillar. A signal may be transmitted from a circuit within the first package substrate 110 though the first connection element 130 to the first semiconductor chip 120, and vice versa.

The second connection element 150 may be disposed on a second area Area2 that does not overlap the first area Area1 on the first package substrate 110. The second area Area2 may be adjacent to the first area Area1. For example, the second area Area2 may be distinct and separate from the first area Area1. The second connection element 150 may be disposed on the first upper pad 112. The second connection element 150 may include a conductive material, and may be in the shape of, for example, a solder, a bump, or a pillar. The second connection element 150 may electrically connect the third connection element 240 to the first package substrate 110.

In an embodiment, the second connection element 150 may have a shape in which a part of an upper surface portion is ground during a grinding operation or process. For example, after the first mold film 140 that covers the first semiconductor chip 120 and the second connection element 150 is formed on the first package substrate 110, the first mold film 140 covering the upper surface portion of the second connection element 150 may be ground and a part of the upper surface portion of the second connection element 150 may be ground together. The grinding operation of grinding a part of the upper surface portion of the second connection element 150 will be described below with reference to FIG. 10.

In an embodiment, the first mold film 140 that covers the first semiconductor chip 120, the first connection element 130, and the second connection element 150 may be formed on the first package substrate 110. The first mold film 140 may be filled in the space between the first package substrate 110, the first semiconductor chip 120, the first connection element 130, and the second connection element 150. For example, space between the first package substrate 110, the first semiconductor chip 120, the first connection element 130, and the second connection element 150 may be filled with the first mold film 140. Accordingly, the first mold film 140 may cover the first package substrate 110, the first semiconductor chip 120, the first connection element 130 (e.g., a connection terminal), and the second connection element 150 (e.g., a connection terminal). In an embodiment, the first mold film 140 covers a side surface of the first semiconductor chip 120 and does not cover the upper surface of the first semiconductor chip 120. That is, the upper surface of the first semiconductor chip 120 may be exposed by the first mold film 140.

The first mold film 140 may include, for example, an insulating polymer material, such as an epoxy molding compound (EMC). The first mold film 140 may include a thermosetting resin such as an epoxy resin, a thermoplastic resin such as polyimide, or a resin having a reinforcing material such as a filler impregnated in the thermosetting resin and the thermoplastic resin, for example, ABF, FR-4, a BT resin, or the like.

The filler may be made of at least one material selected from the group consisting of silica ($SiO_2$), alumina ($Al_2O_3$), silicon carbide (SiC), barium sulfate ($BaSO_4$), talc, mud, mica powder, aluminum hydroxide ($Al(OH)_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and calcium zirconate ($CaZrO_3$). However, the material of the filler is not limited to the above examples, and the filler may include a metal material and/or an organic material.

As shown in FIG. 2, the third connection element 240 may be disposed on and in direct contact with the second connection element 150. That is, while the second connection element 150 and the third connection element 240 may form two layers, the second semiconductor package 200 may be stacked in parallel on the first semiconductor package 100. The third connection element 240 may be formed on the lower surface of the second package substrate 210. The third connection element 240 may contact the lower surface of the second package substrate 210. The third connection element 240 may be disposed on a second lower surface pad 211 included in the second package substrate 210. The third connection element 240 may include a conductive material, and may be in the shape of, for example, a solder, a bump, or a pillar. The third connection element 240 may electrically connect the second package substrate 210 to the second connection element 150. A signal may be transmitted from a circuit within the first package substrate 110 though the second connection element 150 and through the third connection element 240 to a circuit within the second package substrate 210 or to the second semiconductor chip 220, and vice versa. Specifically, the third connection element 240 (e.g., a connection terminal) may electrically connect wiring patterns formed in the second package substrate 210 to the second connection element 150. Accordingly, the third connection element 240 may provide an electrical signal to the wiring patterns or an electrical signal provided from the wiring patterns to the external device.

The second package substrate 210 may be disposed on the third connection element 240. Like the first package substrate 110, the second package substrate 210 may be a PCB or a ceramic substrate. A plurality of wiring patterns may be formed in the second package substrate 210. The wiring pattern may include a plurality of wiring vias electrically connecting the third connection element 240 to components disposed on the second package substrate 210. The wiring pattern may include, but is not limited to, at least one of copper (Cu), aluminum (Al), silver (Ag), tin (Sn), gold (Au), nickel (Ni), lead (Pb), titanium (Ti), or alloys thereof. The characteristics of the second package substrate 210 that are redundant to those of the first package substrate 110 will not be described.

The second semiconductor chip 220 may be disposed on the second package substrate 210. Like the first semiconductor chip 120, the second semiconductor chip 220 may include an IC in which hundreds to millions or more semiconductor elements are integrated inside a single chip. For example, the second semiconductor chip 220 may be, but is not limited to, an AP such as a CPU, a GPU, a FPGA, a digital signal processor, an encryption processor, a microprocessor, a micro-controller, or the like. For example, the second semiconductor chip 220 may be a logic chip such as an ADC or an ASIC, or may also be a memory chip such as a volatile memory (e.g., a DRAM), or a non-volatile memory (e.g., a ROM or a flash memory). Also, the second semiconductor chip 210 may be configured by a combination thereof.

In some embodiments, the second semiconductor chip 220 may be mounted on the second package substrate 210 by a flip chip bonding method. For example, as shown in FIG. 2, the second semiconductor chip 220 may be electrically connected to the second package substrate 210 by a connection element including a conductive material and in the shape of a solder, a bump, or a pillar. However, the embodiments are not limited to this case, and the second semiconductor chip 220 may be mounted on the second package substrate 210 by a wire bonding method.

In some embodiments, the second mold film 230 that covers the second semiconductor chip 220 may be formed on the second package substrate 210. The second mold film 230 may be filled in the space between the second package substrate 210 and the second semiconductor chip 220. For example, space between the second package substrate 210 and the second semiconductor chip 220 may be filled with the second mold film 230. Accordingly, the second mold film 230 may cover the first package substrate 120 and the second semiconductor chip 220. Like the first mold film 140, the second mold film 230 may include, for example, an insulating polymer material, such as an EMC. The description of the material constituting the second mold film 230 is redundant to the description of the material constituting the first mold film 140, and thus will be omitted hereinafter.

The semiconductor package 1000 according to some embodiments may be a side-by-side package in which a plurality of semiconductor chips 120 and 220 are disposed in parallel. In addition, the first semiconductor chip 120 and the second semiconductor chip 220 may be different types of semiconductor chips. For example, when the first semiconductor chip 120 is an AP chip, the second semiconductor chip 220 may be a memory chip. In addition, when the first semiconductor chip 120 is a memory chip, the second semiconductor chip 220 may be an AP chip. As such, the semiconductor package 1000 according to some embodiments may be a system-in-package (SIP) in which different types of semiconductor chips 120 and 220 are electrically connected to each other and operate as a single system.

In a multi-chip package (MCP) structure in which multiple semiconductor chips are bundled into one package, the thickness of the semiconductor chips may be increased to improve heat dissipation characteristics of the semiconductor package. For example, referring to FIG. 2, as the thickness L of the first semiconductor 120 increases, the heat dissipation characteristics of the semiconductor package 1000 may be increased. Thus, the second connection element 150 may be disposed on the first package substrate 110 and the third connection element 240 may be disposed on and in direct contact with the second connection element 150 so that the first semiconductor chip 120 and the second semiconductor chip 220 are disposed in parallel. In this way, the thickness L of the first semiconductor chip 120 may be significantly increased, thereby increasing the heat dissipation characteristics of the semiconductor package 1000.

In an embodiment, the height H2 of the second connection element 150 is higher than the height H1 of the first connection element 130. In this way, the thickness L of the first semiconductor chip 120 may be significantly increased, thereby increasing the heat dissipation characteristics of the semiconductor package 1000. For example, a thickness of the second element 150 may be larger than a thickness of the first connection element 130 in a Z direction. For example, an upper surface of the second element 150 may be higher than an upper surface of the first connection element. In addition, in some embodiments, an upper surface A of the second mold film 230 and an upper surface B of the first semiconductor chip 120 exposed by the first mold film 140 are coplanar with each other. Thus, when a structure for increasing the heat dissipation characteristics of the semiconductor package 1000, such as a heat sink, is additionally disposed on the semiconductor package 1000, structural stability may be provided.

Figure 3:
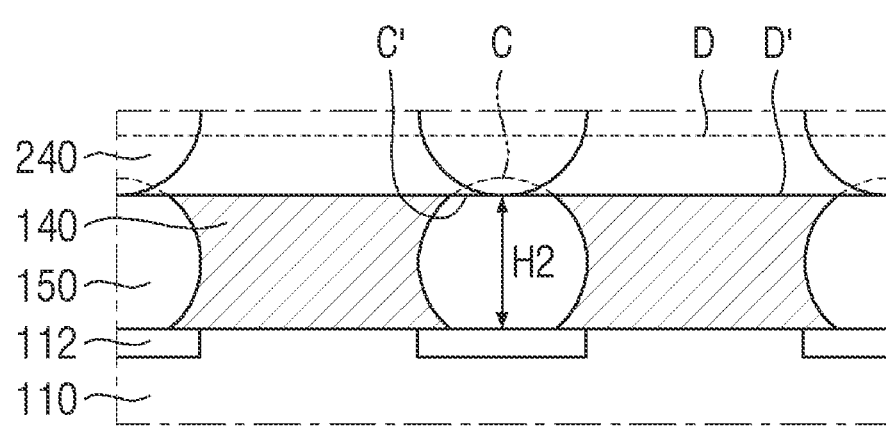
FIG. 3 is an enlarged view of portion II of FIG. 2.
Figure 3:
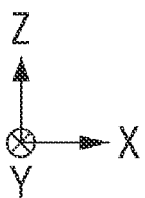

FIG. 3 is an enlarged view of portion II of FIG. 2.

Referring to FIG. 3, a side surface of the second connection element 150 may be covered by the first mold film 140 while an upper surface of the second connection element 150 may be exposed by the first mold film 140. In an embodiment, the second connection element 150 may have a shape in which a part of an upper surface portion is ground. For example, the first mold film 140 covering the upper surface portion of the second connection element 150 may be ground and a part of the upper surface portion of the second connection element 150 may be ground together, so that the upper surface of the second connection element 150 may be exposed by the first mold film 140. For example, a grinding process may be performed on the first mold film 140 to remove a portion of the first mold film 140 covering the upper surface of the second connection element 150 and remove an upper portion of the second connection element 150 to form the upper surface. In an embodiment, the upper surface of the second connection element 150 becomes flat or substantially flat due to the grinding process. As such, the part of the upper surface portion of the second connection element 150 is ground together with the first mold film 140. Accordingly, the amount of contact surface of the second connection element 150 in contact with the third connection element 240 may increase. As a result, the second semiconductor package 200 (shown in FIG. 2) may be stably stacked on the upper surface of the second connection element 150.

In an embodiment, as shown in FIG. 3, an upper surface C of the second connection element 150 in a spherical or elliptical spherical shape is ground together with the first mold film D 140 that covers the upper surface C, and after the grinding process, the upper surface C' of the second connection element 150 and the upper surface D' of the first mold film 140 covering the side surface of the second connection element 150 may be coplanar with each other. As a result, the second semiconductor package 200 (shown in FIG. 2) may be stably stacked on the upper surface of the second connection element 150.

Figure 4:
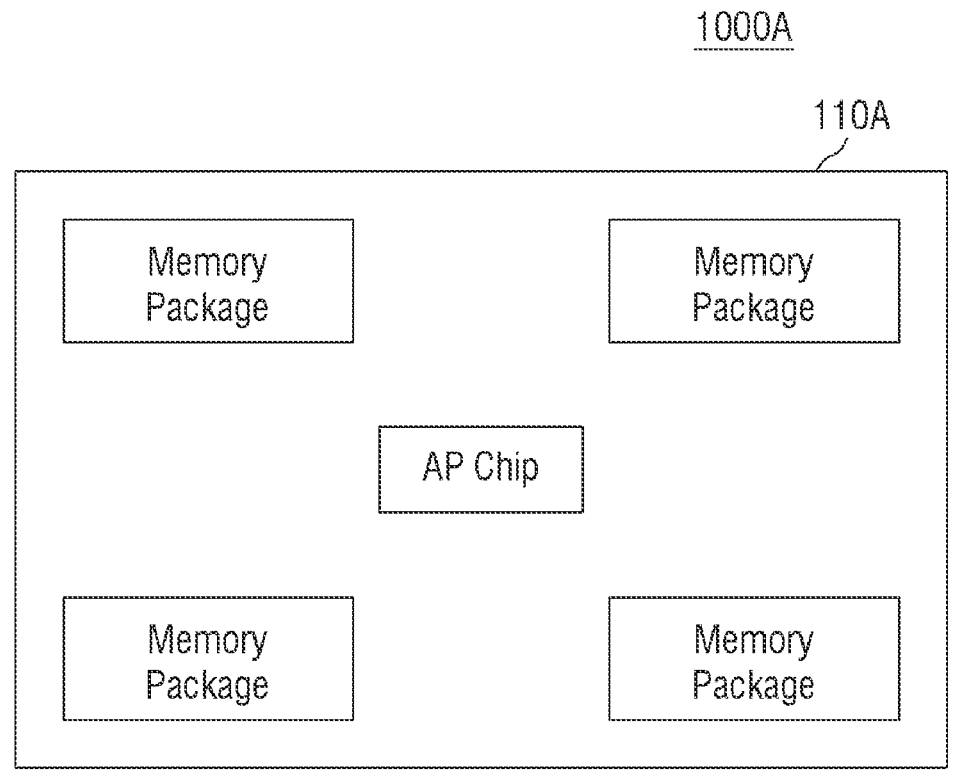
FIG. 4 is an example plan view of a semiconductor package according to an embodiment.
Figure 4:
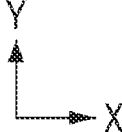

FIG. 4 is an example plan view of a semiconductor package according to an embodiment.

Referring to FIG. 4, a semiconductor package 1000A according to an embodiment may be a SIP in which one AP chip is disposed on a first package substrate 110A and two or more memory packages in each of which a memory chip is mounted are disposed in a side-by-side structure. However, the embodiments are not limited to this case, and the number and arrangement of the AP chips and the memory packages disposed on the first package substrate 110a may vary depending on the embodiment. The semiconductor package 1000 may be implemented by semiconductor package 1000A.

Figure 5:
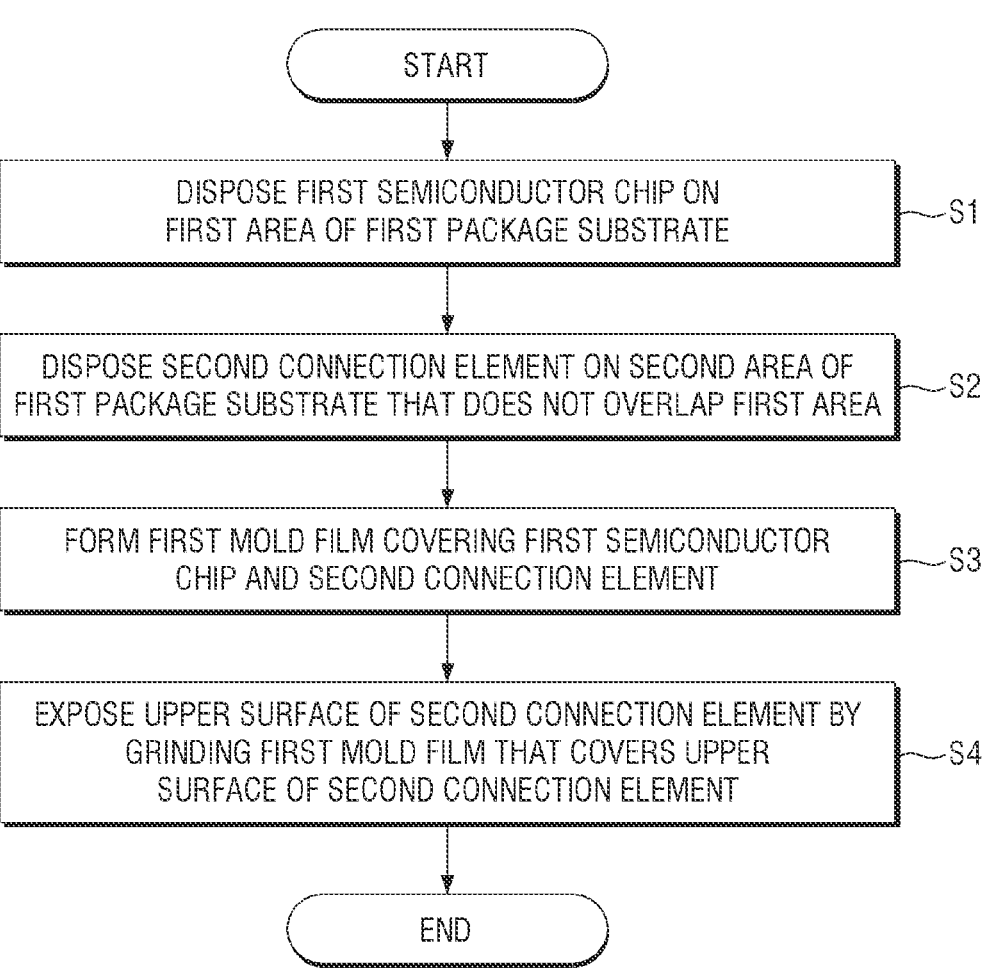
FIGS. 5 and 6 are flowcharts of a method of fabricating a semiconductor package according to an embodiment.
Figure 6:
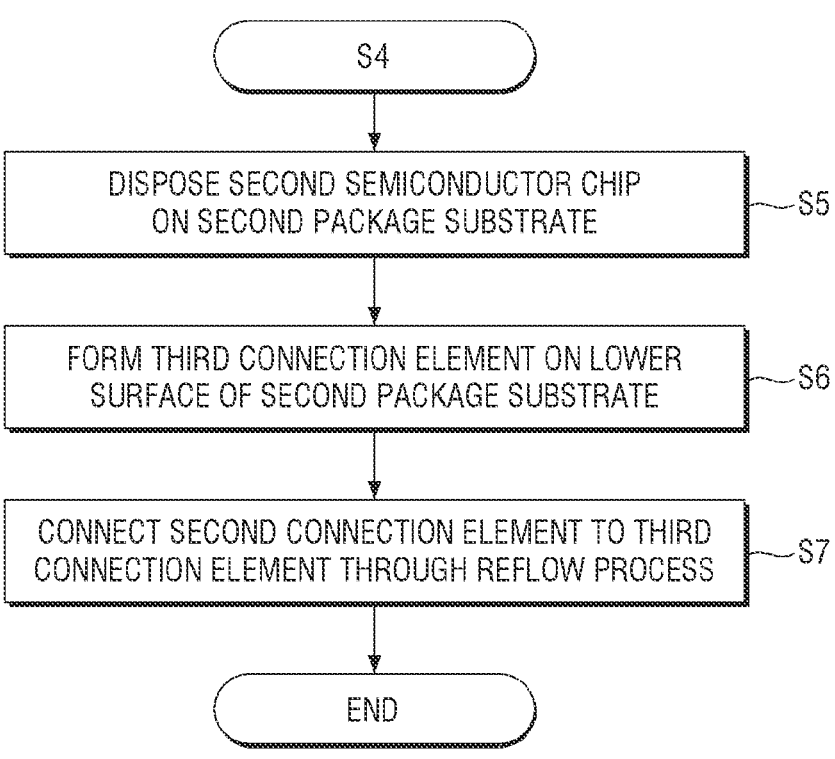

FIGS. 5 and 6 are flowcharts of a method of fabricating a semiconductor package according to some embodiments. FIGS. 7 to 11 and 13 are views illustrating intermediate stages of fabrication, provided to explain a method of fabricating a semiconductor package according to some embodiments.

Figure 7:
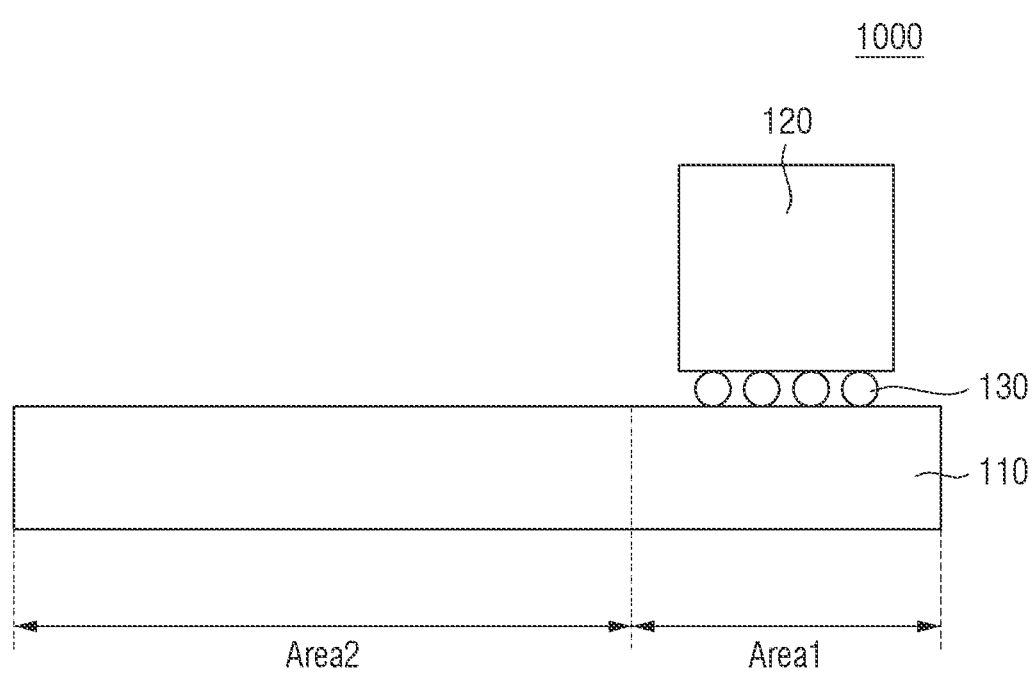
FIGS. 7 to 11 are views illustrating intermediate stages of fabrication, provided to explain a method of fabricating a semiconductor package according to an embodiment.
Figure 7:
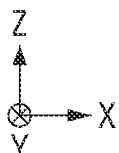

First, referring to FIGS. 5 and 7 together, a first semiconductor chip 120 is disposed on a first area Area1 of a first package substrate 110 in 51. At this time, the first package substrate 110 and the first semiconductor chip 120 may be connected to each other by a first connection element 130 formed between an upper surface of the first package substrate 110 and a lower surface of the first semiconductor chip 120.

Figure 8:
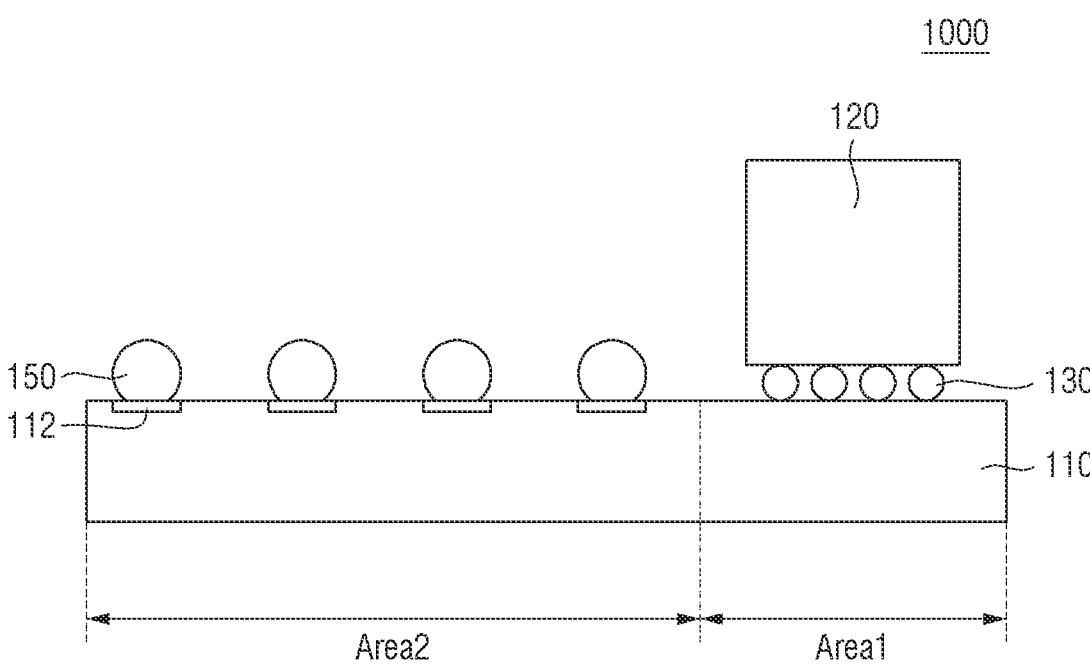
Figure 8:
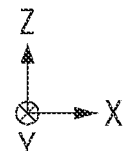

Then, referring to FIGS. 5 and 8 together, a second connection element 150 is disposed on a second area Area2 of the first package substrate 110 that does not overlap the first area Area1 in S2. The second area Area2 may be adjacent to the first area Area1. At this time, the second connection element 150 may be disposed on a first upper pad 112 formed on the upper surface of the first package substrate 110. A plurality of the second connection element 150 may be formed in the second area Area2 on the first package substrate 100. The plurality of the second connection element 150 may be spaced apart from one another and connected to a corresponding first upper pad 112.

Figure 9:
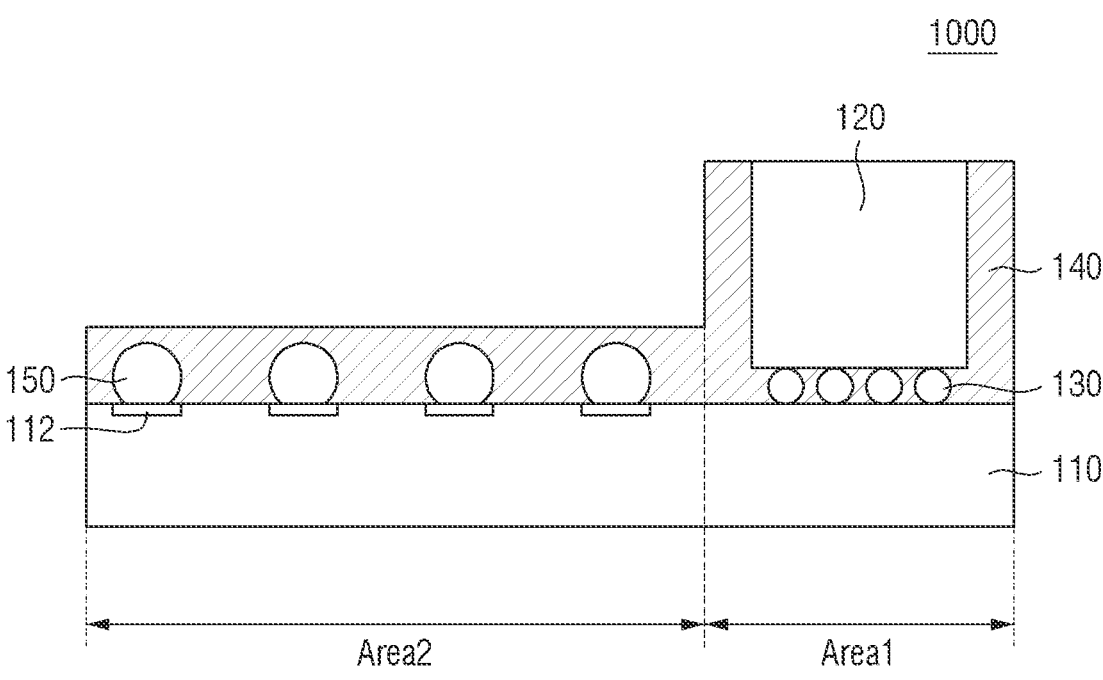
Figure 9:
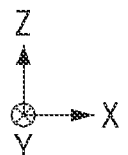

Then, referring to FIGS. 5 and 9 together, a first mold film 140 that covers the first semiconductor chip 120 and the second connection element 150 is formed in S3. At this time, an upper surface portion of the first semiconductor chip 120 may be exposed without being covered by the first mold film 140.

As such, the mold film 140 that covers the first semiconductor chip 120 and the second connection element 150 is formed before the second semiconductor package 200 (shown in FIG. 2) is stacked on the second connection element 150. Accordingly, it is possible to prevent warpage of the first package substrate 110 due to the asymmetric arrangement of the first semiconductor chip 120 disposed in the first area Area1 of the first package substrate 110 and the second semiconductor package 200 disposed in the second area Area2, and to prevent non-wet defects resulting from the warpage.

Figure 10:
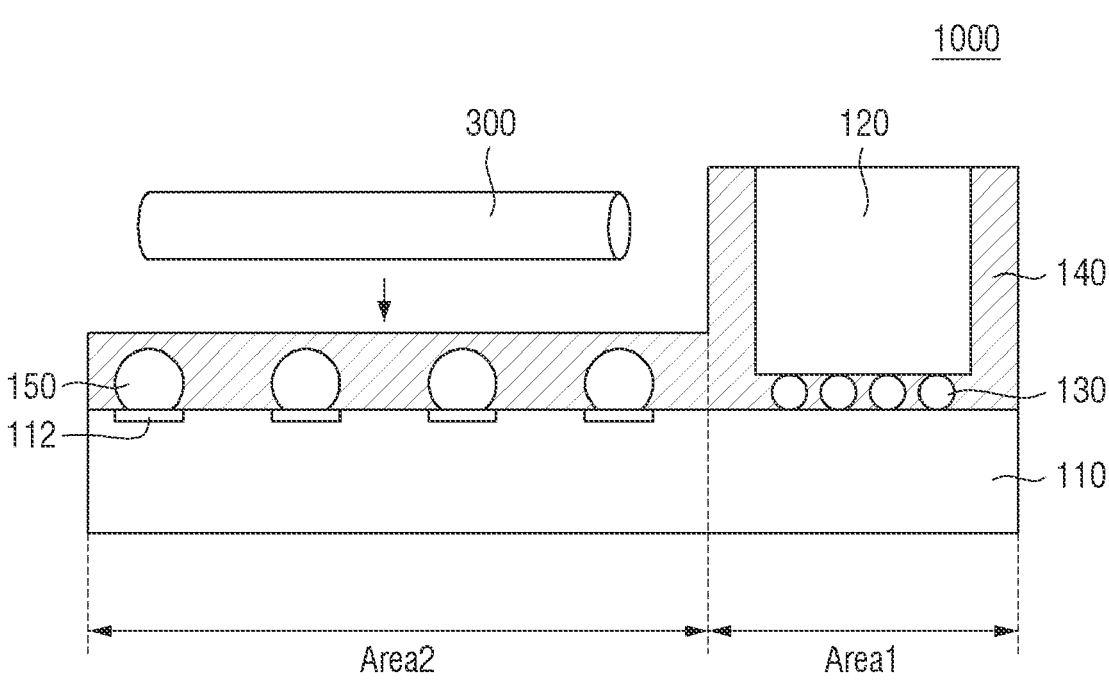
Figure 10:
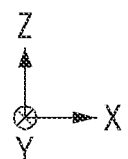
Figure 11:
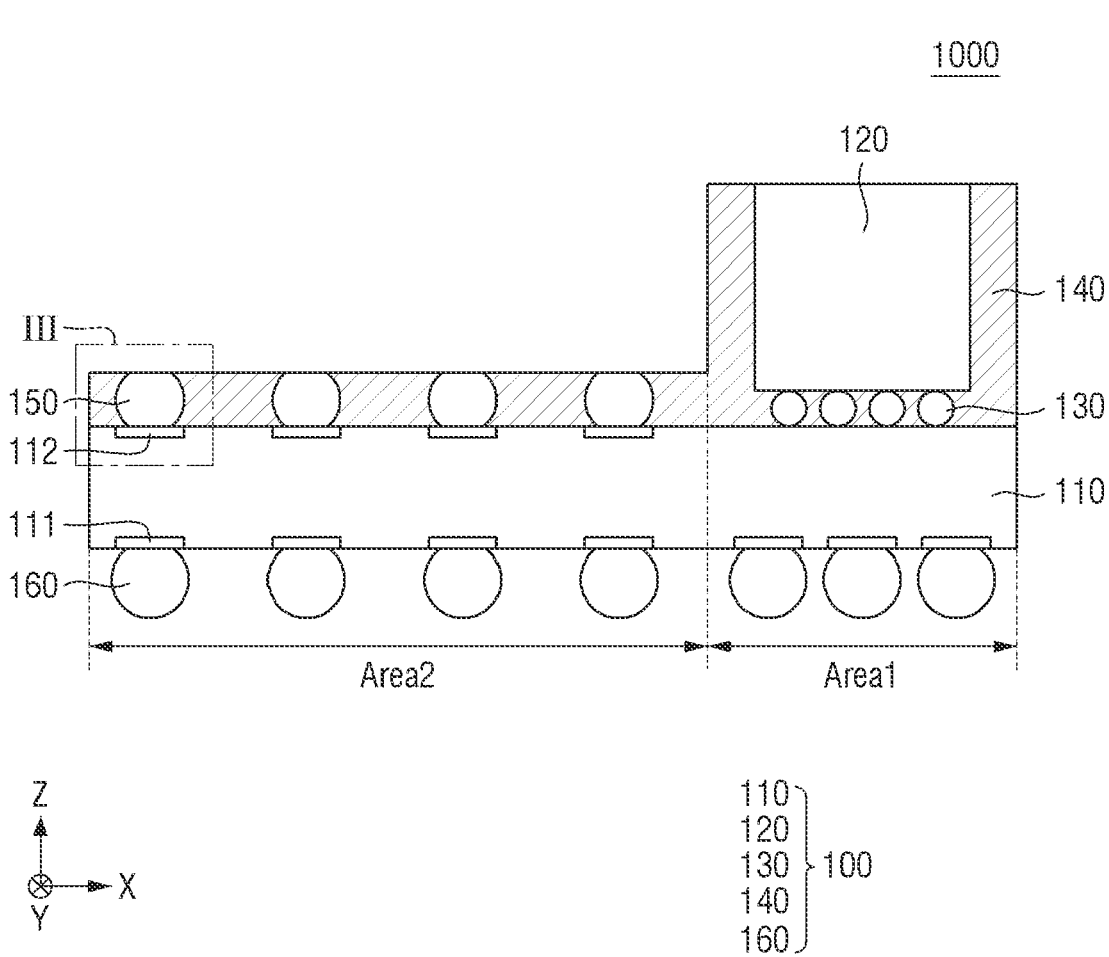

Then, referring to FIGS. 5, 10, and 11 together, the first mold film 140 that covers the upper surface of the second connection element 150 is ground by a grinder 300 to expose the upper surface of the second connection element 150 in S4. At this time, a part of the upper surface portion of the second connection element 150 may be ground together with the first mold film 140. As such, a part of the upper surface portion of the second connection element 150 covered by the first mold film 140 is ground to expose the upper surface of the second connection element 150. Accordingly, the second semiconductor package 200 may be stacked on the second connection element 150 in a side-by-side package structure. Thereafter, a connection structure 160 may be disposed on a first lower pad 111 included in the first package substrate 110.

Figure 12:
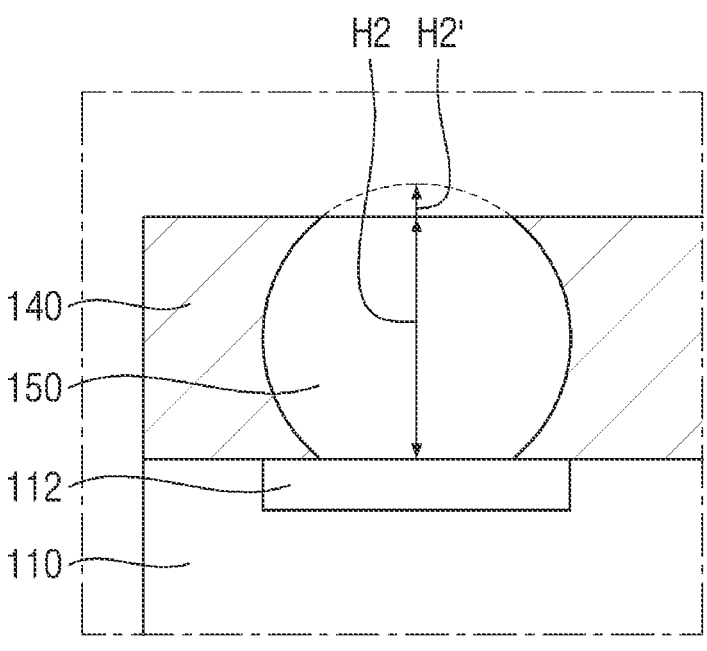
FIG. 12 is an enlarged view of portion III of FIG. 11.

FIG. 12 is an enlarged view of portion III of FIG. 11.

Referring to FIG. 12, in an embodiment, when the height H2' of the second connection element 150 before grinding is A and the height H2 of the second connection element 150 after grinding is B, B/A is greater than or equal to $\frac{1}{100}$.

When a ratio of the height H2 of the second connection element 150 after grinding to the height H2' of the second connection element 150 before grinding is greater than or equal to $\frac{1}{100}$, the second semiconductor package 200 may be stably stacked on the second connection element 150. When the ratio of the height H2 of the second connection element 150 after grinding to the height H2' of the second connection element 150 before grinding is less than $\frac{1}{100}$, the second connection element 150 remaining after grinding may be too small so that the second semiconductor package 200 may not be stably stacked on the second connection element 150.

In an embodiment, the height H2 of the second connection element 150 after grinding is 10 microns (μm) or more. When the height H2 of the second connection element 150 remaining after grinding is 10 μm or more, the second semiconductor package 200 may be stably stacked on the second connection element 150.

Figure 13:
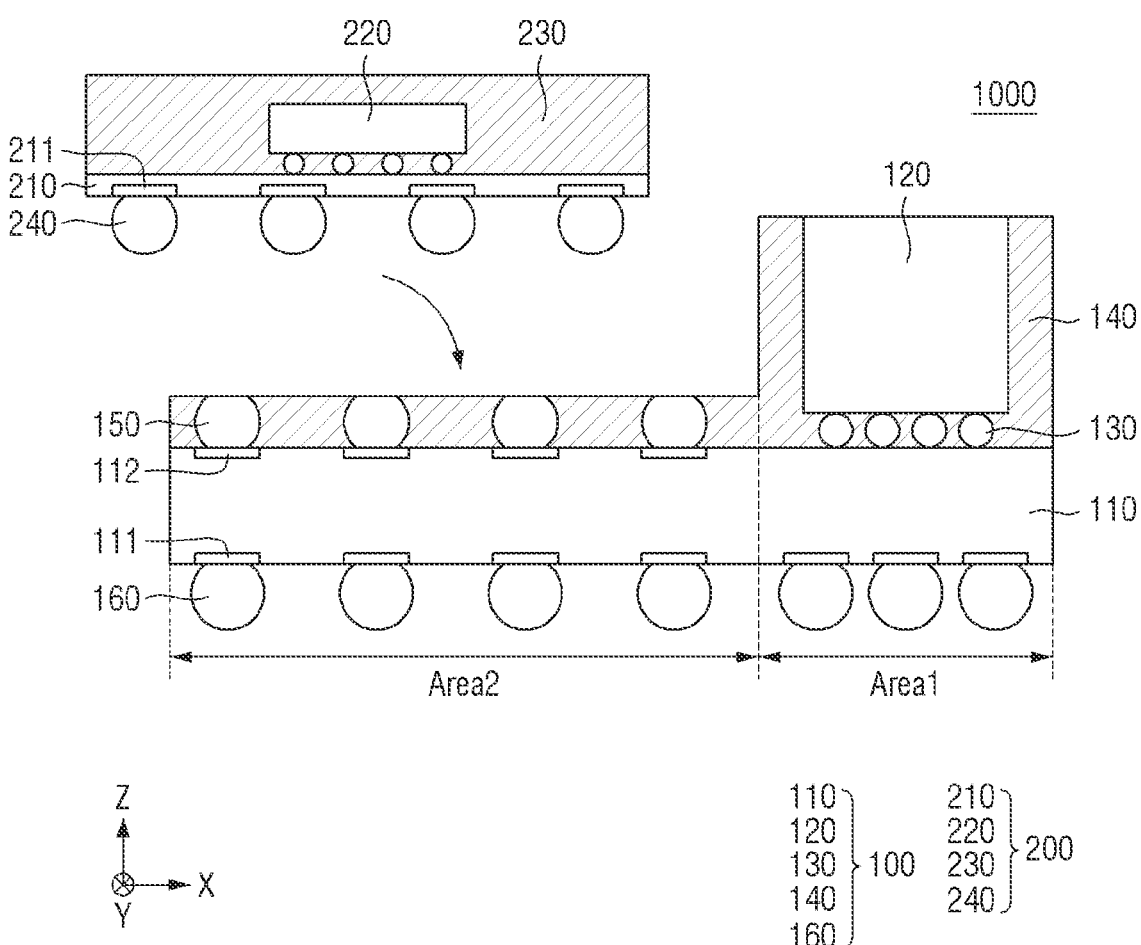
FIG. 13 is view illustrating intermediate stage of fabrication, provided to explain a method of fabricating a semiconductor package according to an embodiment.

Then, referring to FIGS. 6 and 13, a second semiconductor chip 220 is disposed on the second package substrate 210 in S5, and a third connection element 240 is formed on a lower surface of the second package substrate 210 in S6. At this time, the third connection element 240 may be disposed on a second lower pad 211 formed on the lower surface of the second package substrate 210. Thereafter, the second connection element 150 and the third connection element 240 are connected to each other to stack the second semiconductor package 200 on the second connection element 150 in a side-by-side structure in S7. The second connection element 150 and the third connection element 240 may be connected to each other using a reflow process.

As such, the second semiconductor package 200 with the second semiconductor chip 220 mounted therein is disposed in parallel to the first semiconductor chip 120 disposed on the first package substrate 110 in a side-by-side package structure, thereby increasing the thickness of the first semiconductor chip 120 and thus increasing the heat dissipation characteristics of the semiconductor package 1000. The reflow process may include subjecting the second connection element 150 and/or the third connection element 240 to heat to form a liquid and using the liquid to adhere the second connection element 150 to the third connection element 240.

Figure 14:
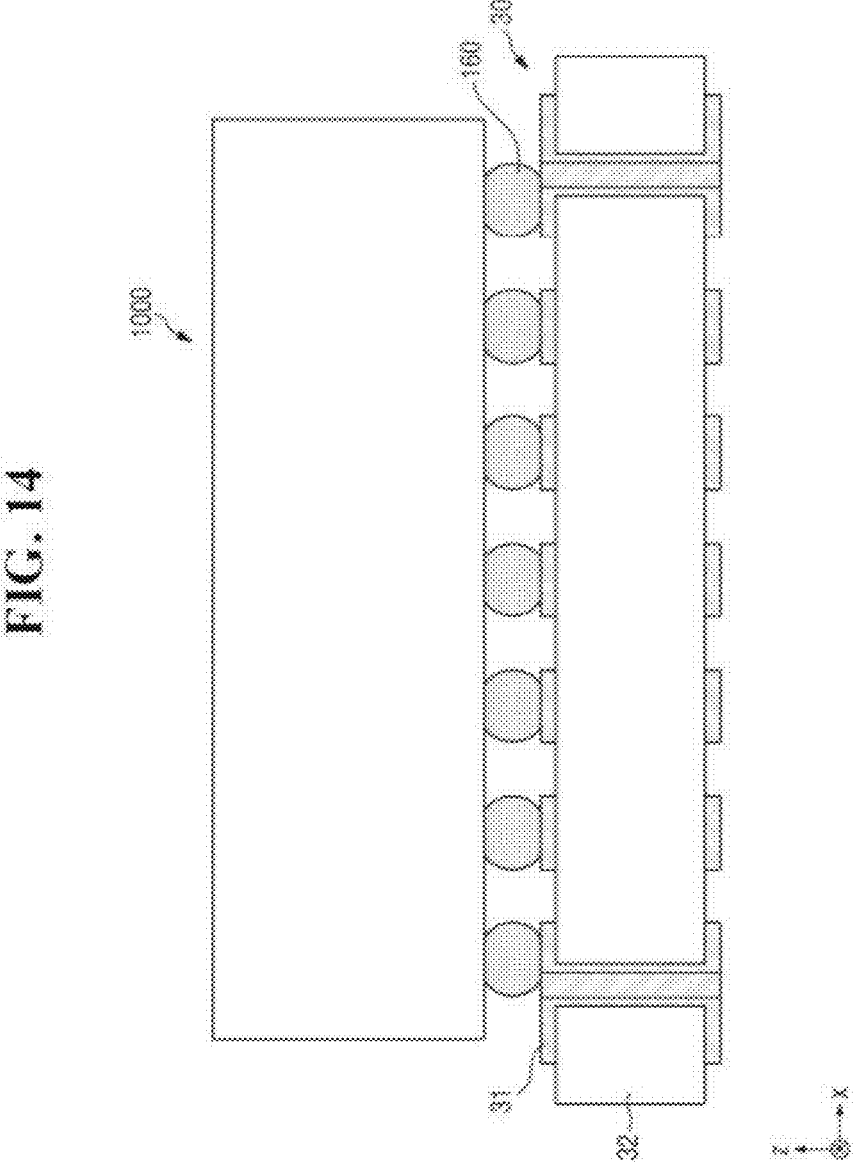
FIG. 14 is a view of a semiconductor package and a main board according to an embodiment.

FIG. 14 is a view of a semiconductor package and a main board according to an embodiment.

Referring to FIG. 14, a semiconductor package 1000 may be disposed on a main board 30. In an embodiment, the semiconductor package 1000 may correspond to the semiconductor package 1000 shown in FIG. 2, that is, a semiconductor package in which the first semiconductor package 100 and the second semiconductor package 200 are stacked in a side-by-side package structure. Also, the semiconductor package 1000 may correspond to the semiconductor package 1000A shown in FIG. 4. For example, a connection structure 160 may be disposed on the main board 30. The main board 30 may be connected to the semiconductor package 1000 by the connection structure 160.

The main board 30 may be a PCB, a ceramic wiring structure, a glass wiring structure, an interposer wiring structure, or the like. However, embodiments of the present disclosure are not limited thereto, and for convenience of description, the following description will assume that the main board 30 is a PCB.

The main board 30 may include an interconnection structure 31 and a core 32. The core 32 may include a copper clad laminate (CCL), PPG, ABF, epoxy, polyimide, and the like. The interconnection structure 31 may include, but is not limited to, at least one of copper (Cu), aluminum (Al), silver (Ag), tin (Sn), gold (Au), nickel (Ni), lead (Pb), titanium (Ti), or alloys thereof.

The core 32 may be disposed at a central part of the main board 30, and the interconnection structure 31 may be disposed above and below the core 32. The interconnection structure 31 may be disposed above and below the main board 30 to be exposed.

Further, the interconnection structure 31 may be disposed to penetrate the core 32. The interconnection structure 31 may electrically connect elements which come into contact with the main board 30. For example, the interconnection structure 31 may electrically connect the semiconductor package 1000 to a host 10 (see FIG. 15). That is, the interconnection structure 31 may electrically connect the semiconductor package 100 to the host 10 through the connection structure 160.

Figure 15:
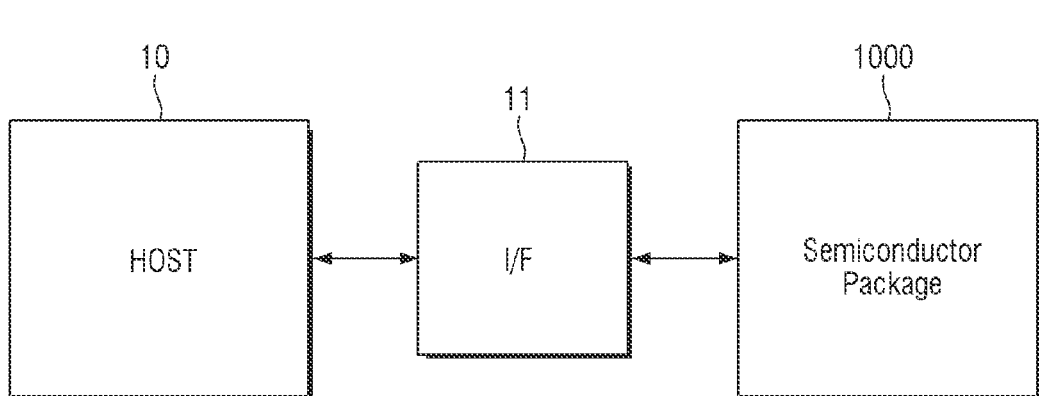
FIGS. 15 and 16 are diagrams for describing an electronic device including a semiconductor package according to an embodiment.
Figure 16:
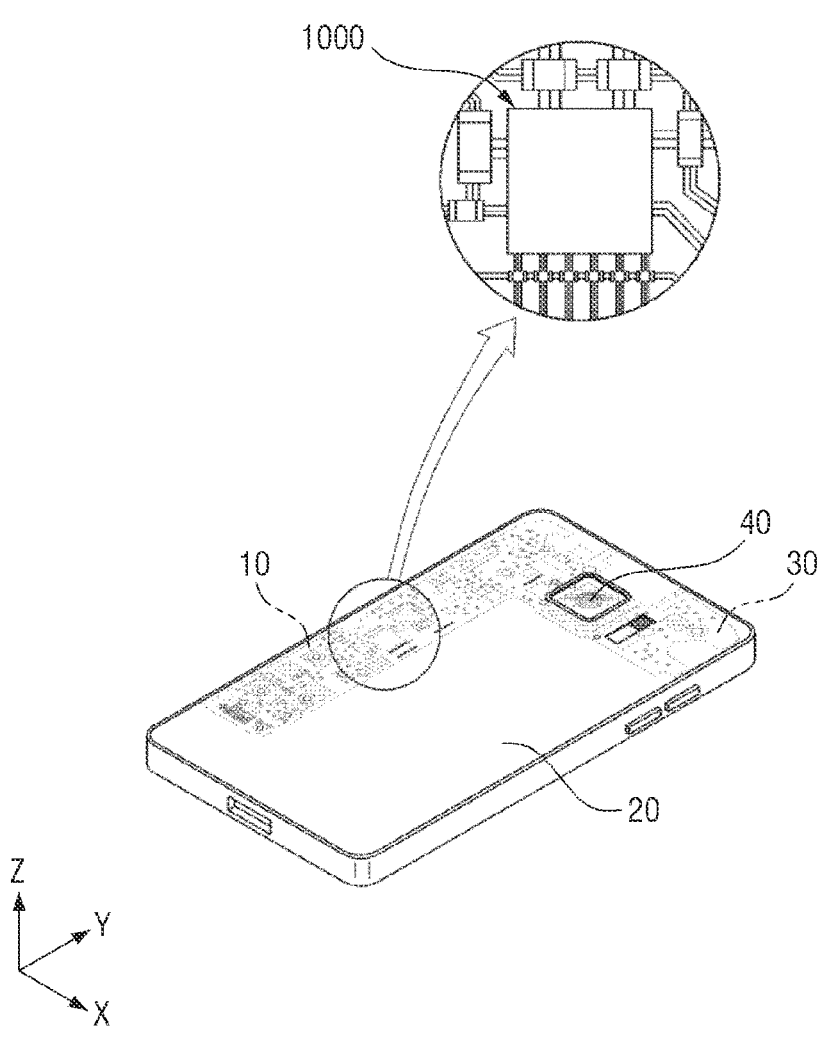

FIGS. 15 and 16 are diagrams for describing an electronic device including a semiconductor package according to an embodiment.

Referring to FIG. 15, an electronic device 1 may include a host 10, an interface 11 (e.g., an interface circuit), and a semiconductor package 1000.

In an embodiment, the host 10 may be connected to the semiconductor package 1000 through the interface 11. For example, the host 10 may transmit a signal to the semiconductor package 1000 to control the semiconductor package 1000. Further, for example, the host 10 may receive a signal from the semiconductor package 1000 and process data included in the signal.

For example, the host 10 may include a central processing unit (CPU), a controller, an application specific integrated circuit (ASIC), and the like. In addition, for example, the host 10 may include a memory chip such as a dynamic random access memory (DRAM), a static RAM (SRAM), a phase-change RAM (PRAM), a magneto resistive RAM (MRAM), a Ferroelectric RAM (FeRAM), and a resistive RAM (RRAM).

Referring to FIGS. 15 and 16, the electronic device 1 may include a host 10, a body 20, a main board 30, a camera module 40, and a semiconductor package 1000.

The main board 30 may be mounted in the body 20 of the electronic device 1. The host 10, the camera module 40, and the semiconductor package 1000 may be mounted on the main board 30. The host 10, the camera module 40, and the semiconductor package 1000 may be electrically connected to each other by the main board 30. For example, the interface 11 may be implemented by the main board 30.

The host 10 and the semiconductor package 1000 may be electrically connected to each other by the main board 30 to transmit and receive signals.

While the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims.

The exemplary embodiments should be considered in a descriptive sense only and not for purposes of limitation.

What is claimed:

1. A semiconductor package comprising:
a first package substrate having a first area and a second area that is distinct and separate from the first area;
a first connection element disposed on the first area and having a first thickness;
a first semiconductor chip connected to the first connection element;
a second connection element disposed on the second area and having a second thickness that is greater than the first thickness;
a third connection element disposed on the second connection element and electrically connected to the second connection element;
a second package substrate disposed on the third connection element; and
a second semiconductor chip disposed on the second package substrate.

2. The semiconductor package of claim 1, further comprising a first mold film configured to cover a side surface of the first semiconductor chip, cover a side surface of the second connection element, and expose an upper surface of the second connection element.

3. The semiconductor package of claim 2, wherein the upper surface of the second connection element is coplanar with an upper surface of the first mold film that covers the side surface of the second connection element.

4. The semiconductor package of claim 2, wherein an upper surface of the first semiconductor chip is exposed by the first mold film.

5. The semiconductor package of claim 4, further comprising a second mold film formed on the second package substrate and configured to cover the second semiconductor chip, wherein an upper surface of the second mold film is coplanar with the upper surface of the first semiconductor chip exposed by the first mold film.

6. The semiconductor package of claim 1, wherein the first semiconductor chip is an Application Processor (AP), and the second semiconductor chip is a memory chip.

7. A semiconductor package comprising:
a first package substrate having a first area and a second area that is distinct and separate from the first area;
a first semiconductor chip disposed on the first area;
a first connection element disposed on the second area;
a mold film configured to cover at least a part of the first semiconductor chip and the first connection element and expose an upper surface of the first connection element;
a second package substrate on the first connection element; and
a second semiconductor chip on the second package substrate.

8. The semiconductor package of claim 7, wherein the mold film covers a side surface of the first semiconductor chip and does not cover an upper surface of the first semiconductor chip.

9. The semiconductor package of claim 7, wherein the mold film covers a side surface of the first connection element.

10. The semiconductor package of claim 9, wherein an upper surface of the mold film covering the side surface of the first connection element is coplanar with the upper surface of the first connection element.

11. The semiconductor package of claim 7, further comprising a second connection element,
wherein the second package substrate is in contact with the first connection element, and
wherein the second connection element is disposed on a lower surface of the second package substrate.

12. The semiconductor package of claim 11, wherein the first connection element and the second connection element enable a signal to be exchanged between the first semiconductor chip and the second semiconductor chip.

13. The semiconductor package of claim 7, further comprising a second connection element configured to connect the first semiconductor chip to the first package substrate,
wherein a thickness of the first connection element is greater than a thickness of the second connection element.

14. A method of fabricating a semiconductor package, comprising:
forming a first semiconductor chip in a first area of a first package substrate;
forming a first connection element in a second area of the first package substrate that is distinct and separate from the first area;
forming a mold film to cover the first semiconductor chip and the first connection element; and
grinding a part of the mold film that covers an upper surface of the first connection element to expose the upper surface of the first connection element while grinding a part of the first connection element.

15. The method of claim 14, wherein when a thickness of the first connection element before the grinding is A and a thickness of the first connection element after the grinding is B, B/A is greater than or equal to $\frac{1}{100}$.

16. The method of claim 15, wherein the thickness of the first connection element after grinding is 10 microns (μm) or more.

17. The method of claim 14, further comprising forming a second semiconductor chip on the first connection element, wherein the second semiconductor chip is disposed on a second package substrate.

18. The method of claim 17, further comprising forming a second connection element on a lower surface of the second package substrate.

19. The method of claim 18, further comprising connecting the first connection element and the second connection element using a reflow process.

* * * * *